(12) United States Patent
Mizugaki (10) Patent No.: US 6,903,990 B2
(45) Date of Patent: Jun. 7, 2005

(54) REFRESH CONTROL FOR SEMICONDUCTOR MEMORY DEVICE

(75) Inventor: Koichi Mizugaki, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/747,402

(22) Filed: Dec. 30, 2003

(65) Prior Publication Data

US 2004/0156257 A1 Aug. 12, 2004

(30) Foreign Application Priority Data

Jan. 15, 2003 (JP) ........................................ 2003-006874

(51) Int. Cl.[7] ................................................. G11C 7/00
(52) U.S. Cl. .................. 365/222; 365/233; 365/230.08
(58) Field of Search ........................... 365/222, 230.06, 365/230.08, 233

(56) References Cited

U.S. PATENT DOCUMENTS 6,336,180 B1 * 1/2002 Long et al. .................... 712/34
6,421,754 B1 * 7/2002 Kau et al. ..................... 710/261
6,597,615 B2    7/2003 Mizugaki
6,789,210 B2 * 9/2004 Satoh et al. .................. 713/501

FOREIGN PATENT DOCUMENTS

JP      A-2002-74945      3/2002

* cited by examiner

*Primary Examiner*—Gene N. Auduong
(74) *Attorney, Agent, or Firm*—Oliff & Berridge PLC (57) ABSTRACT

An external access timing signal becomes active according to changes of the external address. An address latch signal becomes active according to the timing when the external access timing signal becomes active. In a case where the changes of the external address occurs while the address latch signal is active and consequently the external access timing signal becomes active, a refresh arbiter signal does not become active. When the refresh arbiter signal becomes active after the generation of the refresh timing signal, a refresh execution timing signal becomes active according to the change of the refresh arbiter signal. The time period when the address latch signal is active is set to be substantially the same as the preferable activation time period. The time period when the external access timing signal is active is set to be substantially the same as the preferable precharge time period.

2 Claims, 7 Drawing Sheets

|  | #CS | REFRESH MODE (*) |
|---|---|---|
| OPERATION | L | MODE 1 |
| STAND-BY | H | MODE 2 |

(*)

Refresh Mode 1: The refreshing operation starts synchronously with the ATD signal after generation of a refresh timing signal in the memory chip.

Refresh Mode 2: The refreshing operation starts according to generation of a refresh timing signal in the memory chip (address input is not required).

REFRESH CONTROL FOR SEMICONDUCTOR MEMORY DEVICE

BACKGROUND OF THE INVENTION

1. Field of the Invention

This invention relates to a semiconductor memory device equipped with a memory cell array in which dynamic memory cells are arrayed, for example, in a matrix, and in particular to a technique for providing resistance to skew in a semiconductor memory device in spite of skew in the address transferred from an external device.

2. Description of Related Art

Typical examples of a semiconductor memory device include a DRAM and a SRAM. As is well known, the DRAM is more affordable in price and has a larger capacity than the SRAM, but requires a refreshing operation. The SRAM does not require any refreshing operation and is easily handled, but is more expensive and has a smaller capacity than the DRAM.

A virtual static RAM (called VSRAM) is a known semiconductor memory device having the advantages of the DRAM and the SRAM. The virtual SRAM (sometimes also called PSRAM, Pseudo Static RAM) has a memory cell array of dynamic memory cells like the DRAM, and includes a refresh controller to perform the internal refreshing operation.

One example of a virtual SRAM is disclosed in JP2002-74945A.

In the cycle where access is executed in the virtual SRAM, the word lines specified by the address are activated or inactivated in each cycle. The time period for the word line to be activated (hereinafter referred as 'activation time') requires a specific time period. If the cycle time period for the access executed with a single address is shorter than that specific time period, the word line remains inactivated when the word line has not yet been activated sufficiently. Consequently, the data in the memory cell which may be specified by the word lines activated insufficiently may be deleted or rewritten into different data. Hereinafter, the situation in which the data in the memory cell is deleted or rewritten into different data is called 'data destruction.' The time period, from the time when the inactivation of the activated word line is started to the time when the activation of any word line is started, (hereinafter referred to as 'pre-charge time') requires the specific time period. In the case where the pre-charge time is insufficient, the data destruction also may occur.

The too short activation time or pre-charge time may occur when skew occurs in the address transferred from the external device. Accordingly, it is preferable that data destruction does not occur in a semiconductor memory device even when skew in the address occurs, i.e., the device is resistant to skew.

The present invention is made to address the above mentioned problem, and to provide techniques which achieve resistance to skew that may occur in the address transferred from the external device to the semiconductor memory device, equipped with a memory cell array in which dynamic memory cells, e.g., a virtual SRAM, are arrayed in a matrix.

SUMMARY OF THE INVENTION

In order to at least partially address the above mentioned problem, one embodiment of the present invention provides a semiconductor memory device, comprising: a memory cell array of dynamic memory cells; an external access timing signal generation module that outputs an external access timing signal used as a reference for an access operation from an external device, wherein the external access timing signal becomes active according to a change of an external address received from the external device; an address latch signal generation module that outputs an address latch signal indicating a latch timing of the external address, wherein the address latch signal becomes active according to a timing of an inactivation of the external access timing signal; a refresh control module that generates a refresh timing signal used as a reference for an execution timing of a refresh operation to the memory cell array; generates a refresh arbiter signal which becomes active according to a timing of an activation of the external access timing signal; and does not become active in a case where the external access timing signal becomes active because of a change of an external address during a period in which the address latch signal is active; and generates a refresh execution timing signal which becomes active according to an activation of the refresh arbiter signal after an activation of the refresh timing signal; and an external access control module that outputs an external access execution timing signal which indicates an execution timing of the access operation to the memory cell array, wherein the external access execution timing signal becomes active according to at least a timing of activation of the address latch signal; and then becomes inactive according to a timing of activation of the external access timing signal. An active period of the address latch signal is set to be substantially the same as an activation period which is required for one word line to be activated. The one word line is selected from a plurality of word lines included in the memory cell array. An active period of the external access timing signal is set to be substantially the same as a pre-charge period which is required before starting of activation of any word line selected from the plurality of word lines after starting of inactivation of one word line selected from the plurality of word lines.

In the above memory device, the external access timing signal becomes inactive according to a timing of activation of the external access timing signal and becomes active according to a timing of activation of the address latch signal caused by an inactivation of the external access timing signal. The period (an active period) in which the external access timing signal is active is set to be substantially the same as a preferable pre-charge period. Accordingly, this embodiment provides resistance to skew even when the external address changes while the external access timing signal is active according to the previous change of the external address.

In this embodiment, the external address is latched during the period in which the address latch signal is active (active period). The active period of the address latch signal is set to be substantially the same as a preferable activation period. Accordingly, this embodiment provides resistance to skew even when the external address changes while the address latch signal is active.

In this embodiment, the refresh arbiter signal is not generated in a case where the external access timing signal becomes active because of a change of an external address during a period in which the address latch signal is active. Consequently, the refresh operation is not executed and the external access execution timing signal becomes active and consequently the external access is executed, even when the refresh timing signal is generated, because the refresh execution timing signal does not become active. Accordingly, in a case where the external address changes during the active period of the address latch signal, the delay of the start of the external access by the refresh operation can be prevented.

In this embodiment, the active period of the address latch signal is set to be substantially the same as a preferable activation period and the active period of the external access timing signal is set to be substantially the same as a preferable pre-charge period. By setting the active periods of the address latch signal and the external access timing signal in this manner, the time period can be minimized from the start of change of the external address during the active period of the address latch signal, to the change of the external access execution timing signal to active.

It is preferable that the refresh control module comprises: a refresh timer which outputs the refresh timing signal; a refresh requirement signal generation module which includes a refresh arbiter module which outputs the refresh arbiter signal, and outputs a refresh requirement signal which becomes active according to a timing of an activation of the refresh arbiter signal after an activation of the refresh timing signal; and a refresh execution timing signal generation module which outputs the refresh execution timing signal which becomes active according to a timing of an activation of the refresh requirement signal.

With this embodiment, the above mentioned refresh control can be realized.

The present invention may be embodied in a number of modes, such as, for example, a semiconductor memory device, a method for controlling a semiconductor memory device, and an electric device including the semiconductor memory device.

These and other objects, features, aspects and advantages of the present invention will become more apparent from the following detailed description of preferred exemplary embodiments with the accompanying drawings.

DETAILED DESCRIPTION OF PREFERRED EMBODIMENTS

Preferred exemplary embodiments of the invention are described below.

Figure 1:
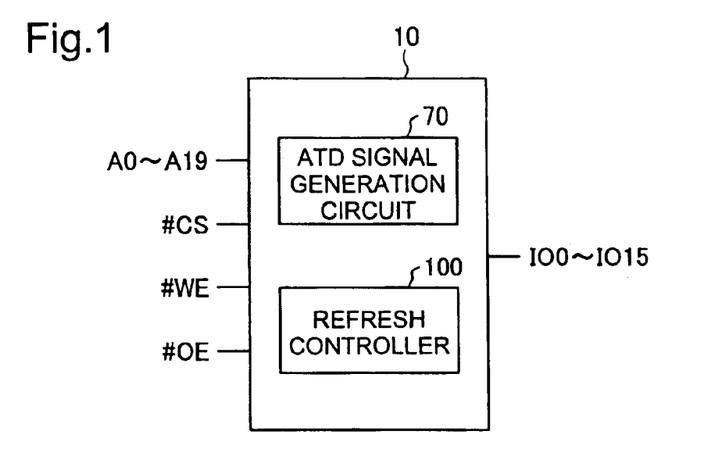
FIG. 1 schematically illustrates the terminal structure of a memory chip in one embodiment of a semiconductor memory device of the present invention.

A. Terminal Structure of Semiconductor Memory Device and Outline of Working Status FIG. 1 schematically illustrates the terminal structure of a memory chip 10 according to one embodiment of a semiconductor memory device of the present invention. The memory chip 10 has multiple terminals given below:

A0 through A19: (20) Address input terminals
CS: Chip select input terminal
WE: Write enable input terminal
OE: Output enable input terminal (Output enable signal input terminal)
IO0 through IO15: (16) Input-output data terminals In the description hereafter, an identical symbol is assigned commonly for both the terminal name and the signal name. The prefix '#' attached to the head of each terminal name (signal name) represents negative logic. Although there are multiple address input terminals A0 through A19 and multiple input-output data terminals IO0 through IO15, they are simplified in the illustration of FIG. 1. The other terminals which are not required for the below explanation, e.g., power terminal, are omitted from the illustration of FIG. 1.

The memory chip 10 is constructed as a virtual SRAM (VSRAM) that is accessible by the same procedure as that for a conventional asynchronous SRAM. Unlike the SRAM, however, the VSRAM uses dynamic memory cells and requires refreshing every predetermined time period (i.e., at predetermined time intervals). A refresh controller 100 described below is accordingly built in the memory chip 10. In the specification hereof, data reading and writing operations from an external device (a control device) are referred to as 'external access' or simply 'access', and refreshing operations executed by the built-in refresh controller are referred to as 'internal refresh' or simply 'refresh'. Refresh may be abbreviated as 'RF'.

The memory chip 10 includes an external access timing signal generation circuit 70, which outputs pulse signals used as a reference for external access according to the variation of the input address (hereinafter referred to as 'external address') A0 through A19 by at least one bit. The respective circuits in the memory chip 10 work in response to an external access timing signal (hereinafter referred to as 'ATD signal') supplied from the external access timing signal generation circuit 70 (hereinafter referred to as 'ATD signal generation circuit').

Figure 2:
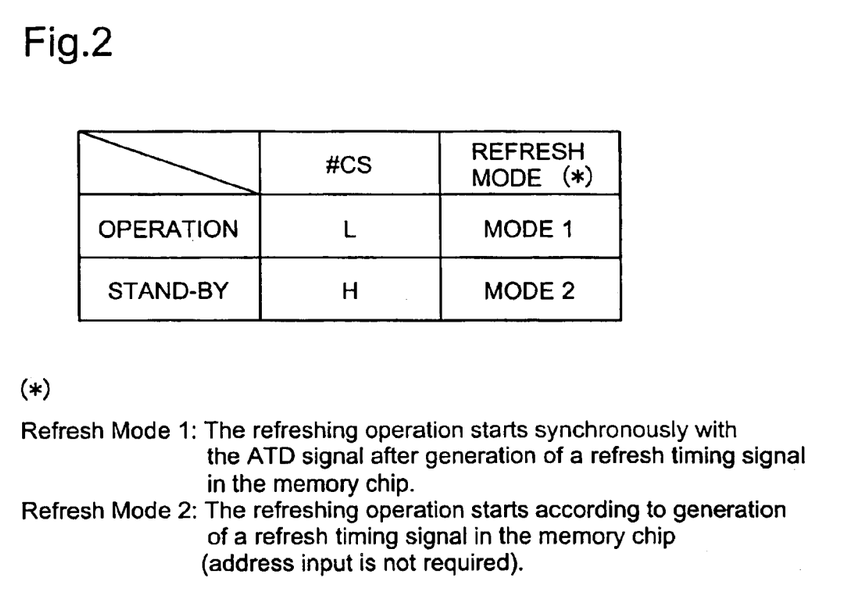
FIG. 2 shows the working status of the memory chip according to the signal levels of the chip select signal #CS.

The chip select signal #CS shown in FIG. 1 is used to regulate the working status of the memory chip 10. FIG. 2 shows the working status of the memory chip 10 according to the signal levels of the chip select signal #CS. In the specification hereof, 'level H' denotes a level '1', which is one of two levels of a binary signal, whereas 'level L' denotes a level '0', which is the other of the two levels of the binary signal.

When the chip select signal #CS is at the level L (active), the internal working status shifts to the operation mode, and a read/write operation cycle is carried out (hereinafter simply referred to as 'operation cycle' or 'read/write cycle'). In the operation cycle, external access is permitted, while internal refresh is executed at adequate timings.

When the chip select signal #CS is at the level H, the internal working status shifts to the stand-by mode, and a stand-by cycle is carried out. In the stand-by cycle, external access is prohibited, and all word lines are inactivated. During the internal refresh, however, a specific word line specified by a refresh address generated by the refresh controller 100 is activated.

The refresh is executed in a first refresh mode in the operation cycle, and is executed in a second refresh mode in the stand-by cycle. In the first refresh mode, the refreshing operation starts synchronously with the ATD signal after generation of a refresh timing signal by the refresh controller 100. In the second refresh mode, on the other hand, the refreshing operation starts immediately after generation of the refresh timing signal by the refresh controller 100. The refreshing operation in the second refresh mode is asynchronous with the ATD signal and accordingly does not require input of an address A0 through A19. The memory chip 10 executes refreshing in the suitable refresh mode corresponding to each of the two working statuses.

In the specification hereof, the expression of 'a certain signal is synchronous with the ATD signal' is not restricted to generation of the certain signal at the same time as an edge of the ATD signal, but means that the certain signal is generated with a fixed time relation to the edge of the ATD signal.

The address data A0 through A19 shown in FIG. 1 is 20-bit data and specifies an address of 1 mega word. The input-output data IO0 through IO15 is 16-bit data corresponding to 1 word. Namely each value of the address A0 through A19 corresponds to 16 bits (1 word), and allows simultaneous input or output of the 16-bit input-output data IO0 through IO15.

In the operation cycle, a write cycle is carried out when the write enable signal #WE is at the level L, whereas a read cycle is carried out when the write enable signal #WE is at the level H. Output from the input-output data terminals IO0 through IO15 is allowed when the output enable signal #OE is at the level L.

Figure 3:
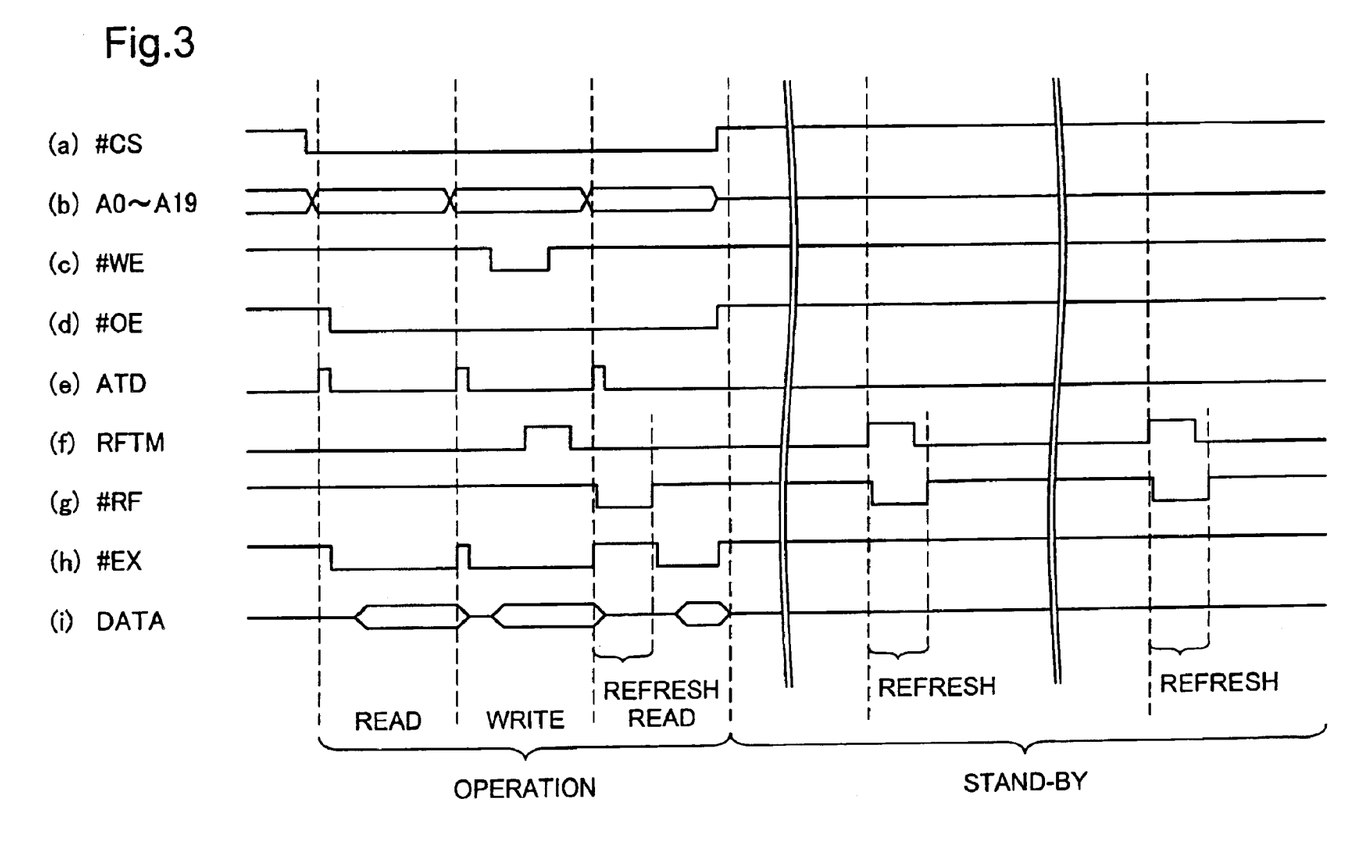
FIG. 3 is a timing chart showing the operations of the memory chip.

FIG. 3 is a timing chart showing the operations of the memory chip 10. Symbols (a) through (d) indicate the signals supplied from an external device to the memory chip 10. Symbols (e) through (h) indicate the signals generated internally. The current working status among the two working statuses (operation and stand-by modes) shown in FIG. 2 is specified at adequate timings according to variations in level of the chip select signal #CS indicated by the symbol (a) in FIG. 3.

In the first three cycles in FIG. 3, the chip select signal #CS is at the level L. Accordingly, the working status is in the operation mode and the operation cycle is carried out. In the operation cycle, the read operation (read cycle) or the write operation (write cycle) is executed according to the external access execution timing signal #EX (indicated by the symbol (h) in FIG. 3) generated synchronously with the ATD signal. In the operation cycle, either the read cycle or the write cycle is executed according to the level of the write enable signal #WE indicated by the symbol (c) in FIG. 3. Output from the input-output data terminals IO0 through IO15 is allowed according to the level of the output enable signal #OE indicated by the symbol (d) in FIG. 3. To be more precise, output from the input-output data terminals IO0 through IO15 is allowed when the output enable signal #OE is at the level L. FIG. 3 shows the status in which the read cycle is executed in the first and third cycles and the write cycle is executed in the second cycle.

In the second cycle, however, the refresh timer in the refresh controller 100 (described below) generates a pulse signal of a refresh timing signal RFTM (indicated by the symbol (f) in FIG. 3) which is at the level H (active) during a specific period. Consequently, in the third cycle, the refreshing operation starts according to the refresh execution timing signal #RF (indicated by the symbol (g) in FIG. 3) generated synchronously with the ATD signal. After the refresh execution timing signal #RF is inactivated, the external access execution timing signal #EX is generated synchronously with the ATD, and the external access is executed according to the external access execution timing signal #EX.

A minimum period Tac of the ATD signal (that is, a minimum period of the variation of the address A0 through A19) corresponds to an operation cycle time (also referred to as 'operation cycle period') of this memory chip 10. The cycle time Tac is set, for example, in a range of about 50 ns to about 100 ns in the random access.

At the fourth cycle in FIG. 3, the chip select signal #CS has risen to the level H and is at the level H during and after the fourth cycle, so that the working status shifts to the stand-by mode at the fourth cycle and the stand-by cycle is executed during and after the fourth cycle. In the stand-by cycle, the refresh execution timing signal #RF is generated immediately after generation of the refresh timing signal RFTM, and the refreshing operation starts according to the refresh execution timing signal #RF. The generation period Trc of the refresh timing signal RFTM corresponds to the refresh cycle time (also referred to as 'refresh cycle period'). The refresh cycle time Trc is set to about 32 $\mu$s in this embodiment. No ATD signal (indicated by the symbol (e) in FIG. 3) is generated when there is no variation of the addresses A0 through A19 (indicated by the symbol (b) in FIG. 3).

B. Internal Structure of Semiconductor Memory Device

Figure 4:
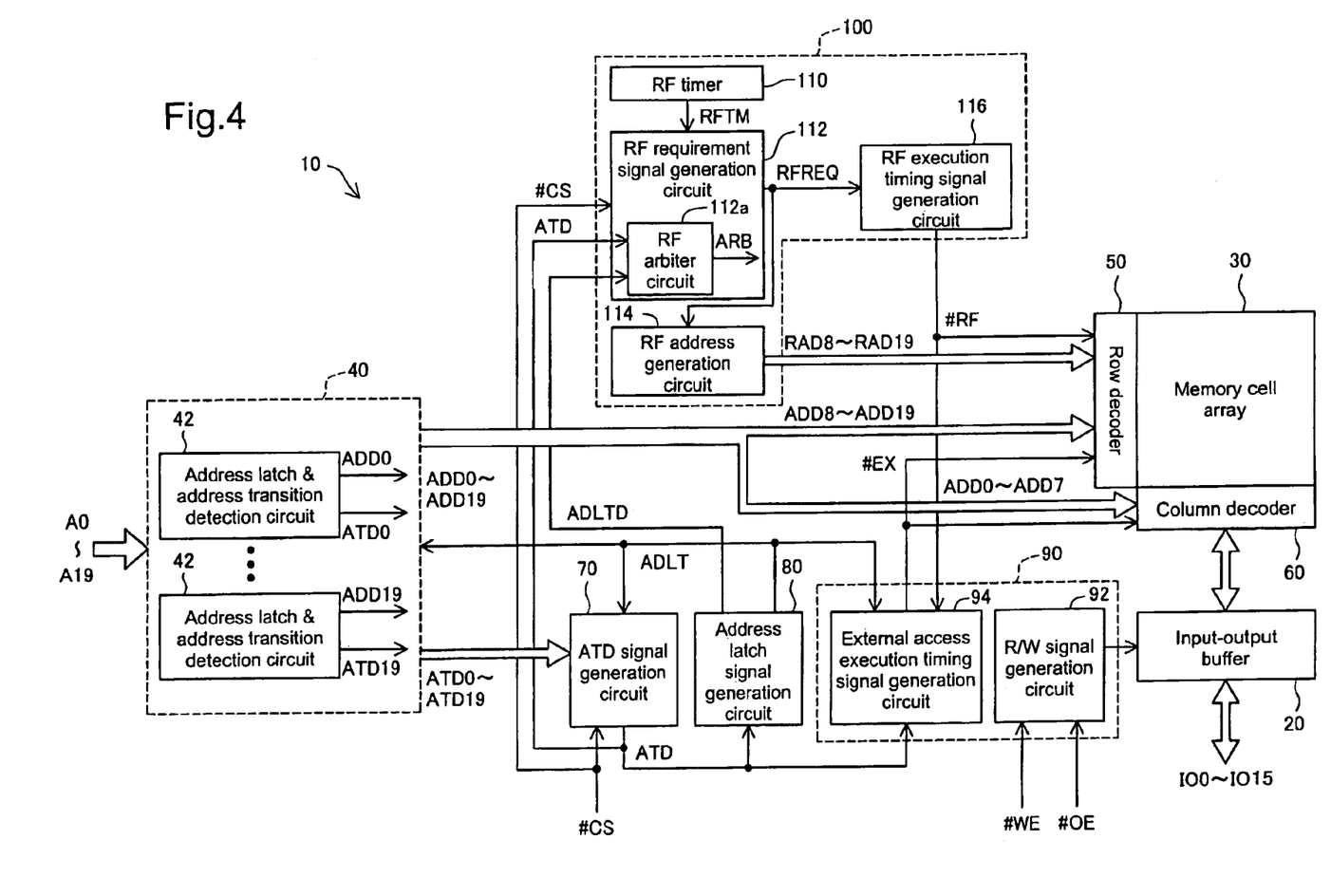
FIG. 4 is a block diagram illustrating the internal structure of the memory chip.

FIG. 4 is a block diagram illustrating the internal structure of the memory chip 10. This memory chip 10 has a data input-output buffer 20, a memory cell array 30, and an address buffer 40. A row decoder 50 and a column decoder 60 are provided between the address buffer 40 and the memory cell array 30. The memory chip 10 also includes the ATD signal generation circuit 70, an address latch signal generation circuit 80, an external access controller 90, and the refresh controller 100.

The structure of the memory cell array 30 is similar to that of a typical DRAM memory cell array. The memory cell array 30 has a plurality of one-transistor, one-capacitor-type memory cells arranged in a matrix. Each memory cell is connected with a word line and a bit line pair (also referred to as data line pair). In this embodiment, the plurality of memory cells are provided in a matrix of 4096 rows and 4096 columns (256×16 columns), i.e. 1 mega word (16 megabit).

The address buffer 40 is a circuit for supplying a plurality of addresses transmitted from an external device to the other internal circuits. In this embodiment, 20-bit addresses (external addresses) A0 through A19 are transmitted.

The address buffer 40 is equipped with 20 address latch & address transition detection circuits 42 corresponding to the 20-bit external addresses A0 through A19. The 20 address latch & address transition detection circuits 42 latch the input external addresses A0 through A19 respectively according to address latch signal ADLT transferred from the address latch signal generation circuit 80, provide lower 8-bit latch address ADD0 through ADD7 to the column decoder 60 as the column address, and provide upper 12-bit latch address ADD8 through ADD19 to the row decoder 50 as the row address.

The row decoder 50 activates selected ones of the 4096 word lines in the memory cell array 30 according to the 12-bit row addresses ADD8 through ADD19 transferred from the address buffer 40 or the 12-bit refresh addresses RAD 8 through RAD 19 transferred from the refresh controller 100. The selection out of the row addresses ADD8 through ADD19 and the refresh addresses RAD 8 through RAD 19 is made according to the refresh execution timing signal #RF transferred from the refresh controller 100 and the external access execution timing signal #EX transferred from the external access controller 90.

The column decoder 60 simultaneously selects bit line pairs of 1 word (16 bits) among multiple bit line pairs in the memory cell array 30 according to a given column address. The selection of the bit line pairs by the column decoder 60 is executed based on the external access execution timing signal #EX.

Accordingly, the memory cells of 1 word (16 bits) are selected from the memory cell array 30 including the memory cells of 1 mega word (16 megabit) based on the 12-bit row addresses ADD8 through ADD19 and the 8-bit column addresses ADD0 through ADD7.

Data of 1 word corresponding to the selected memory cells are read or written via the data input-output buffer 20. The external device gains simultaneous access to the memory cells of 1 word in the memory cell 30 by input of one address A0 through A19 to the memory chip 10. The data input-output buffer 20 includes a non-illustrated reading circuit and a non-illustrated writing circuit and allows data transmission between the data input-output buffer 20 and the memory cell array 30. The memory cell array 30 or the data input-output buffer 20 also includes non-illustrated other constituents, such as a pre-charge circuit, a sense amplifier and a preamplifier.

Twenty address latch & address transition detection circuits 42 in the address buffer 40 detect the variation of the address based on the external addresses A0 through A19 which are input respectively and the corresponding latch addresses ADD0 through ADD19, and then supplies address transition signals ATD0 through ATD19 that show the variation of the address to the ATD signal generation circuit 70. The address latch & address transition detection circuits 42 may be constructed easily using a diversity of logical circuits, for example, D-latch, EXCLUSIVE-OR gate.

The ATD signal generation circuit 70 outputs the external access timing signal ATD (ATD signal) having a specific pulse width based on the 20-bit address transition signals ATD0 through ATD19 and the address latch signal ADLT.

According to the external access timing signal ATD, the address latch signal generation circuit 80 outputs address latch signal ADLT having a specific pulse width, and refresh mask signal ADLTD which is a delayed signal generated by delaying the address latch signal ADLT by a specific time period. The address latch signal ADLT is supplied to the address buffer 40, the ATD signal generation circuit 70 and the external access controller 90. The refresh mask signal ADLTD is supplied to the refresh controller 100.

The external access controller 90 has an R/W signal generation circuit 92 and an external access execution timing signal generation circuit 94. The R/W signal generation circuit 92 outputs a signal for controlling the data input-output in the data input-output buffer 20, and controls reading or writing data to the memory cell array 30, based on the write enable signal #WE and the output enable signal #OE. The external access controller 90 corresponds to the external access controller of an embodiment of the present invention.

The external access execution timing signal generation circuit 94 outputs the external access execution timing signal #EX based on the external access timing signal ATD, the address latch signal ADLT and the refresh execution timing signal #RF, and controls the operation of the row decoder 50 and the column decoder 60.

The refresh controller 100 has a refresh timer 110, a refresh requirement signal generation circuit 112 including a refresh arbiter circuit 112a, a refresh address generation circuit 114 and a refresh execution timing signal generation circuit 116.

The refresh controller 100 outputs the refresh execution timing signal #RF based on the refresh timing signal RFTM supplied from the refresh timer 110, the external access timing signal ATD supplied from the ATD signal generation circuit 70 (ATD signal), the refresh mask signal ADLTD supplied from the address latch signal generation circuit 80 and the chip select signal #CS. The refresh controller 100 controls the inner refresh in the memory cell array 30 by the refresh execution timing signal #RF.

The refresh timer 110 outputs a pulse signal, as the refresh timing signal RFTM, which is activated for a predetermined time period at regular time intervals of the refresh cycle. The refresh timer 110 may be constructed as a ring oscillator, for example. The refresh cycle time Trc is set to about 32 $\mu$s as described above.

The refresh requirement signal generation circuit 112 outputs refresh requirement signal RFREQ based on the refresh timing signal RFTM supplied from the refresh timer 110 and the refresh arbiter signal ARB output from the refresh arbiter circuit 112a. The refresh requirement signal RFREQ is supplied to the refresh address generation circuit 114 and to the refresh execution timing signal generation circuit 116.

The refresh execution timing signal generation circuit 116 outputs the refresh execution timing signal #RF according to the refresh requirement signal RFREQ.

The refresh address generation circuit 114 outputs 12-bit refresh addresses RA8 through RA19 according to the refresh requirement signal RFREQ. The refresh address generation circuit 114 may be constructed with a 12-bit counter, for example.

Each of the circuits mentioned above can be constructed easily using a diversity of ordinary logical circuits which realize each function. Therefore, their explanation is omitted.

C. Practical Operations of External Access Controller and Refresh Controller

The practical operations of the external access controller 90 and the refresh controller 100 in the operation mode are described hereinbelow, in the following order: (1) Case where address skew does not occur (regular operation); (2) Case where address skew occurs while external access timing signal ATD is active (address skew 1); (3) Case where address skew occurs while address latch signal ADLT is active (address skew 2); and (4) Case where address skew occurs after address latch signal ADLT becomes inactive (address skew 3).

As shown in the timing chart in FIG. 3, in the stand-by mode where the chip select signal #CS is at the level H (inactive), when the refresh timing signal RFTM changes to and keeps the level H (active), the refresh execution timing signal #RF consequently changes to and keeps the level L (active) for a specific time period, and then the refresh operation is executed.

C1. Regular Operation (Without Address Skew)

Figure 5:
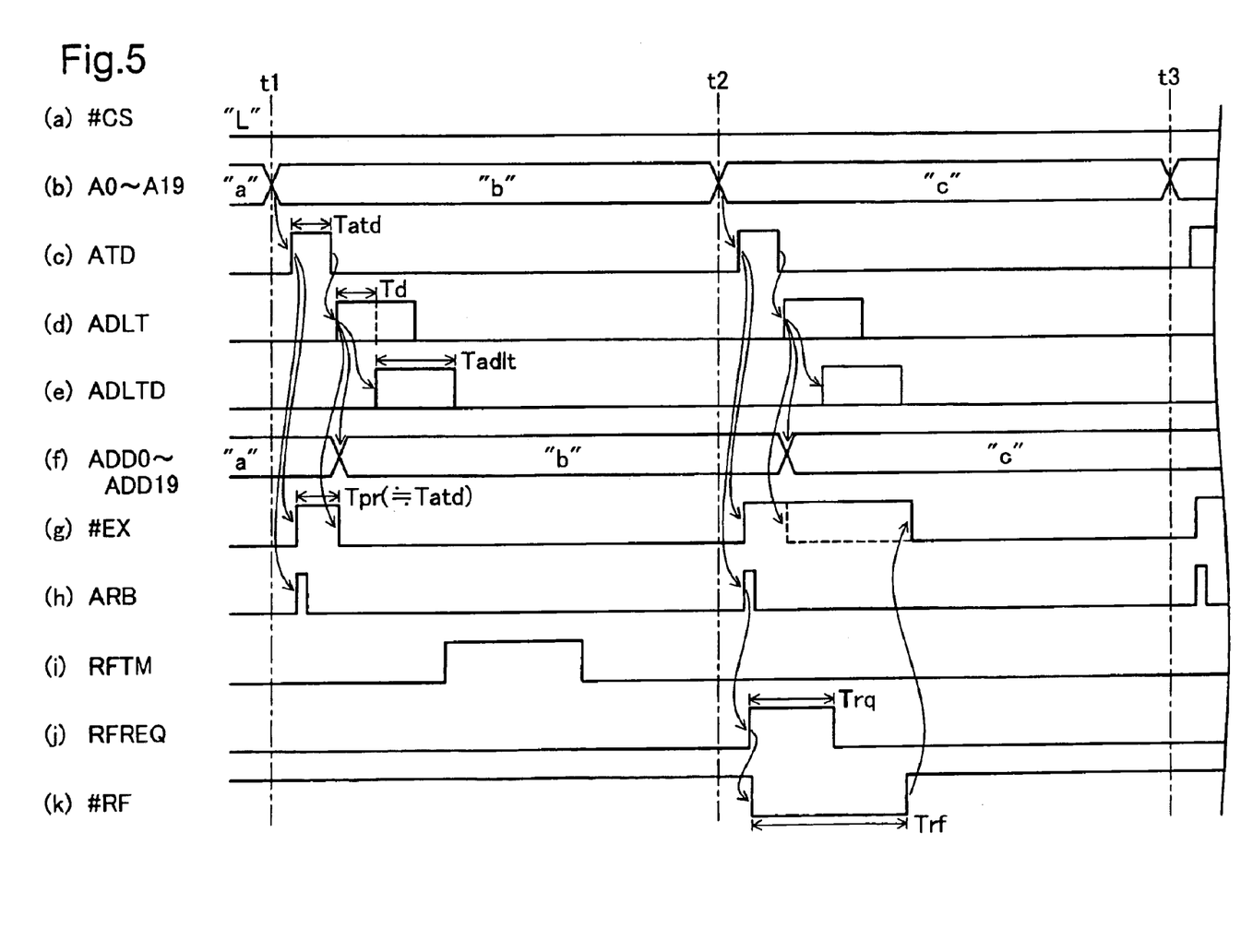
FIG. 5 shows the timing chart for each signal when no address skew occurs.

FIG. 5 shows the timing chart for each signal when no address skew occurs. The operation in this mode is called 'regular operation'.

In the operation mode, the chip select signal #CS (indicated by the symbol (a) in FIG. 5) is at the level L (active). The cycle between times t1 and t2 is the cycle where the refresh timing signal RFTM (indicated by the symbol (i) in FIG. 5) has not changed to the level H (active) in the non-illustrated previous cycle and the refresh operation is not executed. The cycle between times t2 and t3 is the cycle where the refresh timing signal RFTM has changed to the level H in the previous cycle between time t1 and t2, and the refresh operation is executed consequently.

When the addresses A0 through A19 (indicated by the symbol (b) in FIG. 5) vary, the external access timing signal ATD (indicated by the symbol (c) in FIG. 5) changes to the level H (active) consequently, keeps the level H for a predetermined time period Tatd, and then goes back to the level L (inactive). The external access timing signal ATD is the pulse signal having the specific pulse width Tatd.

When the external access timing signal ATD changes to the level H, the external access execution timing signal #EX (indicated by the symbol (g) in FIG. 5) changes from the level L (active) to the level H (inactive) consequently, and the external access that has started from the cycle before the time t1 concludes.

The refresh arbiter signal ARB (indicated by the symbol (h) in FIG. 5) is a pulse signal that changes to the level H (active) according to the change of the external access timing signal ATD to the level H. However, when the refresh mask signal ADLTD is at the level H (active), the refresh arbiter signal ARB does not change to the level H and keeps the level L (inactive) even if the external access timing signal ATD changes to the level H, as described below. The refresh mask signal ADLTD is not used when the address skew does not occur.

When the external access timing signal ATD changes to the level L, the address latch signal ADLT (indicated by the symbol (d) in FIG. 5) changes to the level H (active) consequently, keeps the level H for a predetermined time period Tadlt, and then goes back to the level L (inactive). The address latch signal ADLT is the pulse signal having the specific pulse width Tadlt.

The refresh mask signal ADLTD (indicated by the symbol (e) in FIG. 5) is a signal generated by delaying the address latch signal ADLT by a specific time period Td.

When the address latch signal ADLT changes to the level H, the external addresses A0 through A19 are latched consequently and the latch addresses ADD0 through ADD19 (indicated by the symbol (f) in FIG. 5) are output. While the address latch signal ADLT is at the level H, the latch addresses ADD0 through ADD19 do not change and keep the values of the external address when the address latch signal ADLT changed to the level H, even if the external addresses A0 through A19 change. Accordingly, the external address when the address latch signal ADLT changed to the level H is fixed as the address to be used in the external access.

During the cycle between the times t1 and t2, when the address latch signal ADLT changes to the level H, the external access execution timing signal #EX changes to the level L (active) consequently. When the external access execution timing signal #EX changes to the level L, the latch addresses ADD0 through ADD19 (indicated by the symbol "b"), i.e. the memory cells corresponding to the fixed external addresses, are selected and the external access is executed. In the next cycle, when the external access timing signal ATD changes to the level H according to the change of the external addresses ADD0 through ADD19 at the time t2, the external access execution timing signal #EX changes to the level H consequently. With this operation, the operation of the external access in the cycle between the times t1 and t2 concludes.

Because the refresh timing signal RFTM has not changed to the level H in the non-illustrated cycle before the time t1 as described above, the refresh requirement signal RFREQ (indicated by the symbol (j) in FIG. 5) also keeps the level L (inactive) in the cycle between the times t1 and t2. Consequently, the refresh execution timing signal #RF (indicated by the symbol (g) in FIG. 5) keeps the level H (inactive) and the refresh is not executed.

If the refresh timing signal RFTM does not changed to the level H in the cycle between the times t1 and t2 and the pulse signal is not generated, the operation in the cycle between the times t2 and t3 would be same as that in the cycle between the times t1 and t2. When the address latch signal ADLT changes to the level H, the external access execution timing signal #EX changes to the level L consequently. When the external access execution timing signal #EX changes to the level L, the latch addresses ADD0 through ADD19 (indicated by the symbol "c"), i.e., the memory cells corresponding to the fixed external addresses, are selected and the external access is executed.

However, because the refresh timing signal RFTM changes to the level H in the cycle between the times t1 and t2 and a pulse signal is generated, the external access timing signal ATD changes to the level H, the refresh arbiter signal ARB changes to the level H, and consequently, the refresh requirement signal RFREQ changes to the level H (active), keeps the level H for a predetermined time period Trq, and then goes back to the level L (inactive). When the refresh requirement signal RFREQ changes to the level H, the refresh execution timing signal #RF changes to the level L (active) consequently, keeps the level L for a predetermined time period Trf, and then goes back to the level H (inactive). Accordingly, the memory cells corresponding to the non-illustrated refresh addresses RAD8 through RAD19 are selected and the refresh is executed.

In the cycle between the times t2 and t3, when the external access timing signal ATD changes to the level H, the refresh execution timing signal #RF changes to the level L consequently, as described above. While the refresh execution timing signal #RF is at the level L, the external access execution timing signal #EX does not change to the level L immediately after the change of the address latch signal ADLT into the level H, but changes to the level L after coming back of the refresh execution timing signal #RF to the level H. In other words, when the refresh is executed, the external access is executed after the refresh.

The external access execution timing signal #EX changes to the level H according to the change of the external access timing signal ATD to the level H, described above. When the refresh is not executed, the external access execution timing signal #EX changes to the level L according to the change of the address latch signal ADLT to the level H caused by the change of the external access timing signal ATD to the level L. It is understood from the above described facts that the time period Tpr of the external access execution timing signal #EX, from the change to the level H to the return to the level L, is set to be substantially the same as the time period Tatd in which the external access timing signal ATD keeps the level H.

The time period Tpr of the external access execution timing signal #EX, from the change to the level H to the return to the level L, corresponds to the time period from the start of the activation of the word line which was selected in the cycle prior to the start of the activation of the word line which will be selected in the next cycle. The time period is called 'pre-charge time'.

As is known, if the pre-charge time is too short, it may cause data destruction. Accordingly, it is preferable that the time period Tatd in which the external access timing signal ATD keeps the level H is set to be the time period that is the same as or longer than the desirable pre-charge time which is required to prevent the data destruction.

C2. Address Skew 1

Figure 6:
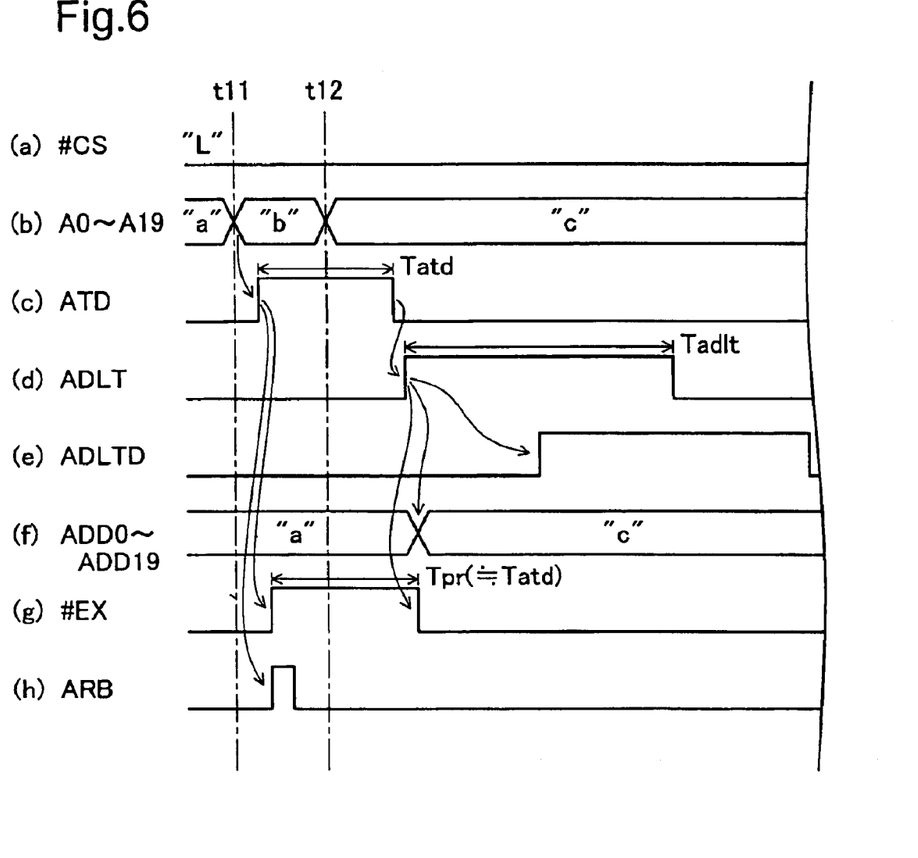
FIG. 6 shows the timing chart for each signal when an address skew occurs while the external access timing signal ATD is active.

FIG. 6 shows the timing chart for each signal when an address skew occurs while the external access timing signal ATD is active. FIG. 6 shows the address skew in which the addresses A0 through A19 change (from "b" to "c") at the time t12 while the external access timing signal ATD (indicated by the symbol (c) in FIG. 6) is at the level H (active) caused by the change of the external addresses A0 through A19 (indicated by the symbol (b) in FIG. 6) at the time t11.

As described above, the external access timing signal ATD changes to the level H according to the change of the external addresses A0 through A19 at the time t11, and then goes back to the level L after the specific time period Tatd. When the external access timing signal ATD changes to the level L, the address latch signal ADLT (indicated by the symbol (d) in FIG. 6) changes to the level H consequently. Accordingly, the external addresses A0 through A19 at the time when the address latch signal ADLT changes to the level H, i.e., the external addresses A0 through A19 generated at the time t12 (indicated by the symbol "c") are latched and output as the latch addresses ADD0 through ADD19 to be used as the fixed addresses. In other words, the external addresses A0 through A19 generated at the time t11 (indicated by the symbol "b") are ignored and the external addresses A0 through A19 generated at the time t12 (indicated by the symbol "c") are used as the fixed addresses.

The external access execution timing signal #EX also changes to the level L according to the change of the address latch signal ADLT to the level H. When the external access execution timing signal #EX changes to the level L, the memory cells corresponding to the latch addresses ADD0 through ADD19 (indicated by the symbol "c") are selected consequently, and the external access starts.

As described above, in case that the addresses change (i.e., the address skew) during the time period Tatd in which the external access timing signal ATD is at the level H, the external addresses generated before the address skew (in this embodiment, "b") are masked, the external addresses generated after the address skew (in this embodiment, "c") are latched, the memory cells corresponding to the designated addresses are selected, and the external access is executed. In other words, when the address skew occurs during the time period Tatd in which the external access timing signal ATD keeps the level H, the generated addresses are masked and the operation same as regular operation is executed.

To achieve the benefit that the regular operation is executed even if the address skew occurs, the more that the time period in which the external access timing signal ATD keeps the level H, i.e., the pulse width Tatd of the external access timing signal ATD, exceeds the preferable pre-charge time described above, the better. However, the longer the pulse width Tatd becomes, the longer the time period, from the change of the external address followed by the activation of the external access execution timing signal #EX to the start of the external access (hereinafter referred to as 'access time'), becomes. Accordingly, considering the access time, too long of a pulse width Tatd is not preferable. The setting of the pulse width Tatd of the external access timing signal ATD is further described below.

C3. Address Skew 2

Figure 7:
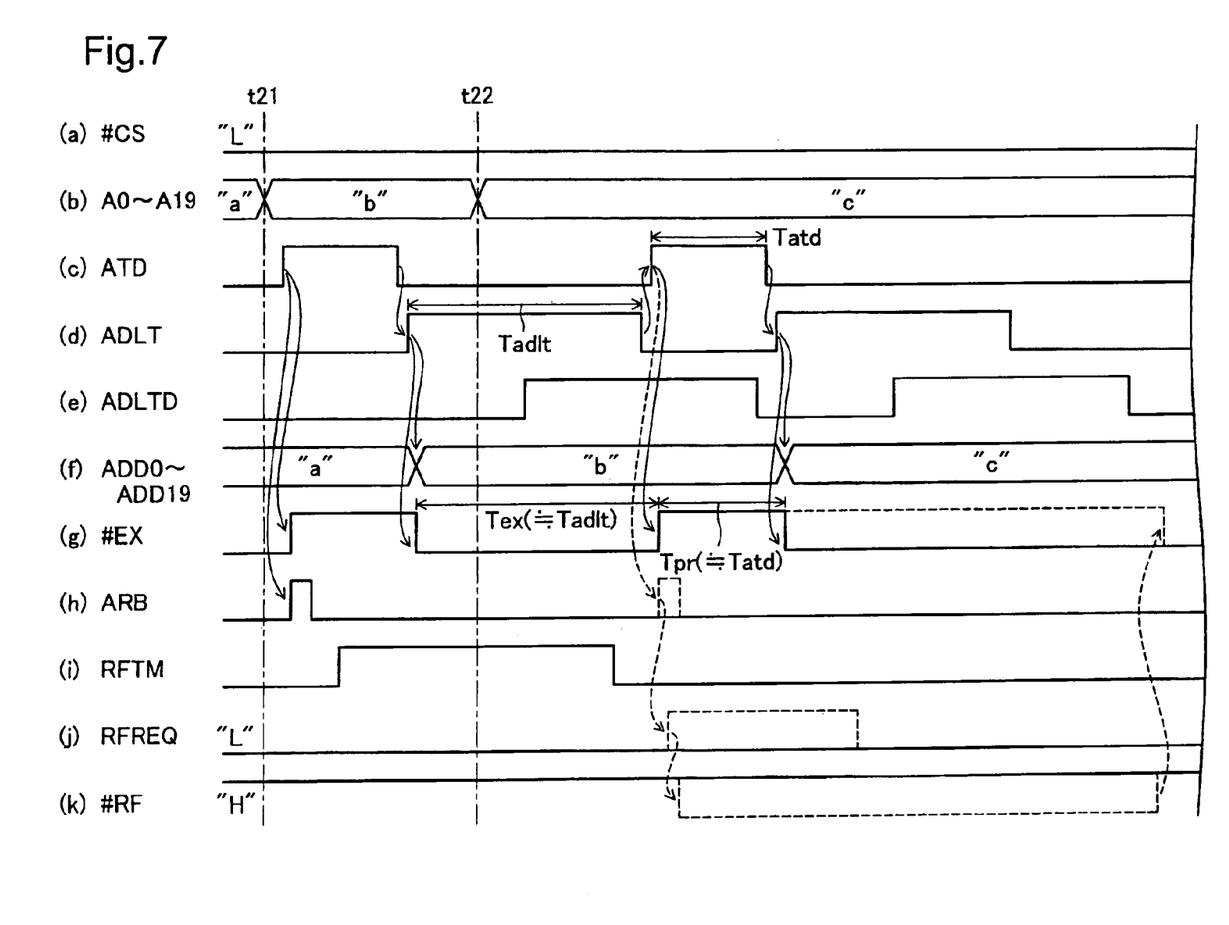
FIG. 7 shows the timing chart for each signal when an address skew occurs while the address latch signal ADLT is active.

FIG. 7 shows the timing chart for each signal when an address skew occurs while the address latch signal ADLT is active. FIG. 7 shows the address skew in which the addresses A0 through A19 change (from "b" to "c") at the time t22 in the period Tadlt when the address latch signal ADLT (indicated by the symbol (d) in FIG. 7) is at the level H (active) caused by the change of the external addresses A0 through A19 (indicated by the symbol (b) in FIG. 7) at the time t21 (from "a" to "b").

As described above, the external access timing signal ATD changes to the level H according to the change of the external addresses A0 through A19 at the time t21, and then goes back to the level L after the specific time period Tatd. When the external access timing signal ATD changes to the level L, the address latch signal ADLT (indicated by the symbol (d) in FIG. 7) changes to the level H consequently. Accordingly, the external addresses A0 through A19 at the time when the address latch signal ADLT changes to the level H, i.e., the external addresses A0 through A19 generated at the time t21 (indicated by the symbol "b") are latched and output as the latch addresses ADD0 through ADD19 to be used as the fixed addresses.

The external access execution timing signal #EX changes to the level L according to the change of the address latch signal ADLT to the level H. When the external access execution timing signal #EX changes to the level L, the memory cells corresponding to the latch addresses ADD0 through ADD19 (indicated by the symbol "b") are selected consequently, and the external access starts.

Even when the external addresses A0 through A19 change at the time t22, the external access timing signal ATD does not change to the level H immediately after the change. When the address latch signal ADLT changes to the level L, the change of the external addresses A0 through A19 is detected, and the external access timing signal ATD changes to the level H and then goes back to the level L after the specific time period Tatd. As described above, when the external access timing signal ATD changes to the level H, the external access execution timing signal #EX changes to the level H and the external access to the memory cells corresponding to the external addresses A0 through A19 generated at the time t21 (indicated by the symbol "b") concludes.

When the external access timing signal ATD changes to the level L, the operation that is the same as the regular operation starts consequently. More precisely, the address latch signal ADLT changes to the level H, the external addresses A0 through A19 generated at the time t22 (indicated by the symbol "c") are latched and output as the latch addresses ADD0 through ADD19 to be used as the fixed addresses.

The external access execution timing signal #EX also changes to the level L according to the change of the address latch signal ADLT to the level H. When the external access execution timing signal #EX changes to the level L, the memory cells corresponding to the latch addresses ADD0 through ADD19 (indicated by the symbol "c") are selected consequently, and the external access starts.

The refresh arbiter signal ARB (indicated by the symbol (h) in FIG. 7) is generated according to the change of the external access timing signal ATD to the level H in the regular operation. However, when the address skew occurs during the time period Tadlt in which the address latch signal ADLT is at the level H, e.g., the change of the addresses A0 through A19 at the time t22, the refresh arbiter signal ARB is masked by the refresh mask signal ADLTD (indicated by the symbol (e) in FIG. 7). The refresh mask signal ADLTD may be generated by delaying the address latch signal ADLT.

In the following description, it is assumed that the refresh arbiter signal ARB (indicated by the symbol (h) in FIG. 7)

is not masked as shown by the broken line in FIG. 7. In case where the refresh timing signal RFTM (indicated by the symbol (i) in FIG. 7) has changed to the level H, the refresh requirement signal RFREQ (indicated by the symbol (j) in FIG. 7) changes to the level H according to the generation of the refresh arbiter signal ARB. When the refresh requirement signal RFREQ changes to the level H, the refresh execution timing signal #RF (indicated by the symbol (k) in FIG. 7) changes to the level L consequently, and the refresh is executed. When the refresh is executed, the external access execution timing signal #EX does not change according to the change of the address latch signal ADLT to the level L, but changes to the level L after the refresh, i.e., the change of the refresh execution timing signal #RF to the level H.

Accordingly, the access time, in the case where the address skew described above occurs and the refresh arbiter signal ARB is generated and the refresh is executed, is longer than the access time, in the case where the refresh is executed in the regular operation shown in FIG. 5, by the time period Tex in which the external access before the address skew is executed.

However, in the memory chip 10 of this embodiment, the extension of the access time by the address skew described above is reduced by the three measures described below.

(1) First Measure

When the address skew occurs described above, the refresh arbiter signal ARB is masked. By doing so, the refresh requirement signal RFREQ does not change to the level H and the refresh execution timing signal #RF does not change to the level L, even though the refresh timing signal RFTM changes to the level H. Consequently, when the address skew by which the external addresses A0 through A19 change occurs during the time period Tadlt in which the address latch signal ADLT is at the level H, the refresh is not executed and the external access is executed according to the generation of the external access timing signal ATD. Accordingly, the access time can be reduced by the time for the refresh that is not actually executed.

(2) Second Measure

As described above, when the address skew, by which the external addresses A0 through A19 change, occurs during the time period Tadlt in which the address latch signal ADLT is at the level H, the external access execution timing signal #EX keeps the level L for the time period Tex, which is substantially the same as Tadlt, and the external access of the memory cell corresponding to the external addresses A0 through A19 (indicated by the symbol "b") starts.

As is known, if the activation time is too short, in which the word line corresponding to the selected address is activated after the start of the external access, data destruction may occur. Accordingly, it is preferable that the time period Tex, in which the external access of the memory cells corresponding to the external addresses A0 through A19 (indicated by the symbol "b") before the address skew occurs, i.e., the time period Tadlt in which the address latch signal ADLT is at the level H, is set in the time period to be the same as or longer than the desirable activation time which is required to prevent the data destruction. By doing so, the data destruction can be prevented even if the address skew, by which the addresses A0 through A19 change, occurs during the time period Tadlt in which the address latch signal ADLT is at the level H.

The longer the time period Tadlt in which the address latch signal ADLT is at the level H is, the more successful it is for the prevention of the data destruction by the address skew that occurs during the time period Tadlt.

However, lengthening the time period Tadlt in which the address latch signal ADLT is at the level H results in the delay of the time when the external access execution timing signal #EX changes to the level L, and extension of the access time for the external addresses A0 through A19 (indicated by the symbol "c") generated at the time t22.

With the view of reducing the access time in the case where the address skew, by which the external addresses A0 through A19 change, occurs during the time period Tadlt in which the address latch signal ADLT is at the level H, the time period in which the address latch signal ADLT is at the level H, i.e., the pulse width Tadlt of the address latch signal ADLT, is set to a time period that is substantially the same as the preferable activation time. 'The time period that is substantially the same as the preferable activation time' means the time period that is as short as possible, but not shorter than the preferable activation time, and ideally, a time period that is the same as the preferable activation time.

With this embodiment, the time period which is required for the external access to the external address before the occurrence of address skew can be minimized, and accordingly, the access time can be reduced as much as possible.

(3) Third Measure

The time period Tpr is preferably set to be a time period that is longer than the preferable pre-charge time period required for the prevention of the data destruction, described above. In other words, the time period Tatd in which the external access timing signal ATD keeps the level H is preferably set to a time period that is longer than the preferable pre-charge time period required for the prevention of the data destruction. The time period Tpr starts from the change of the external access execution timing signal #EX to the level H caused by the expiration of the time period Tex for the external access to the external addresses A0 through A19 (indicated by the symbol "b") before the address skew. The time period Tpr ends with going back of the #EX to the level L and the start of the external access to the external addresses A0 through A19 after the occurrence of the address skew (indicated by the symbol "c").

The longer the time period in which the external access timing signal ATD keeps the level H, i.e., the pulse width Tatd of the external access timing signal ATD, the better for the prevention of the data destruction by the address skew that occurred during the time period Tatd, as described above.

However, lengthening the time period Tatd in which the external access timing signal ATD keeps the level H results in the delay of the time when the external access execution timing signal #EX changes to the level L. Accordingly, the access time for the external addresses A0 through A19 (indicated by the symbol "c") generated at the time t22 becomes long.

With the view of reducing the access time in the case where the address skew, by which the external addresses A0 through A19 changes, occurs during the time period Tadlt in which the address latch signal ADLT is at the level H, the following aspect is preferable. The time period in which the external access timing signal ATD is at the level H, i.e., the pulse width Tatd of the external access timing signal ATD, is set to be a time period that is substantially the same as the preferable pre-charge time. 'The time period that is substantially the same as the preferable pre-charge time' means the time period that as short as possible, but not shorter than the preferable pre-charge time, and ideally, the time period is the same as the preferable pre-charge time.

With this embodiment, the time period which is required for the external access to the external address until the occurrence of address skew can be minimized, and accordingly, the access time can be reduced as much as possible.

C4. Address Skew 3

In the case where the address skew occurs after the address latch signal ADLT becomes inactive, the operation is the same as the usual operation when address skew does not occur (the regular operation).

As described above, the memory chip 10 provides resistance to address skew. With this embodiment, refresh is not executed even if the refresh timing signal RFTM has been generated already, in the case where the address skew occurs during the time period in which the address latch signal ADLT is active, i.e. the time period when the address is being latched. This can prevent the situation in which the access time when the address skew occurs is longer than the access time when the address skew does not occur.

D. Application to Electrical Apparatus

Figure 8:
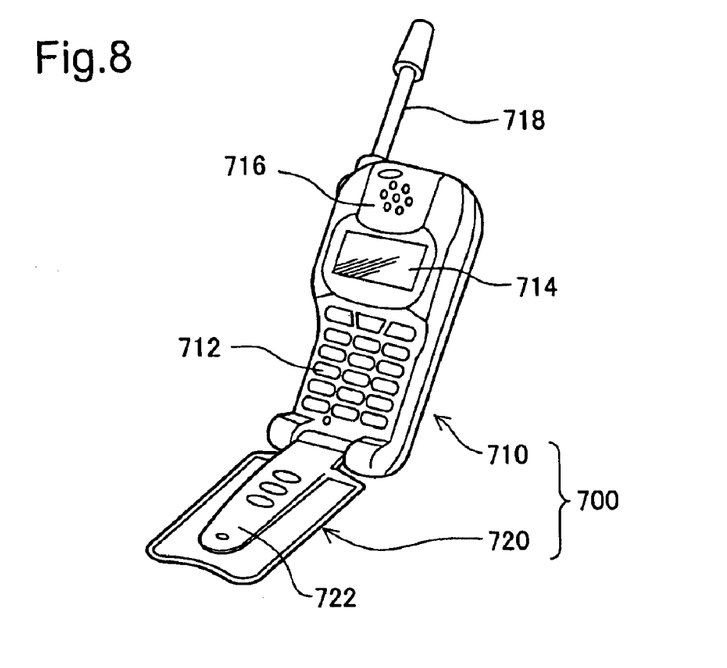
FIG. 8 is a perspective view illustrating a cellular phone as one application of a semiconductor memory device of the present invention to an electronic apparatus.

FIG. 8 is a perspective view illustrating a cellular phone as one application of a semiconductor memory device of the present invention to an electronic apparatus. The cellular phone 700 has a main body 710 and a cover member 720. The main body 710 has a keyboard 712, a liquid crystal display 714, a receiver module 716, and an antenna module 718. The cover member 720 has a microphone module 722.

Figure 9:
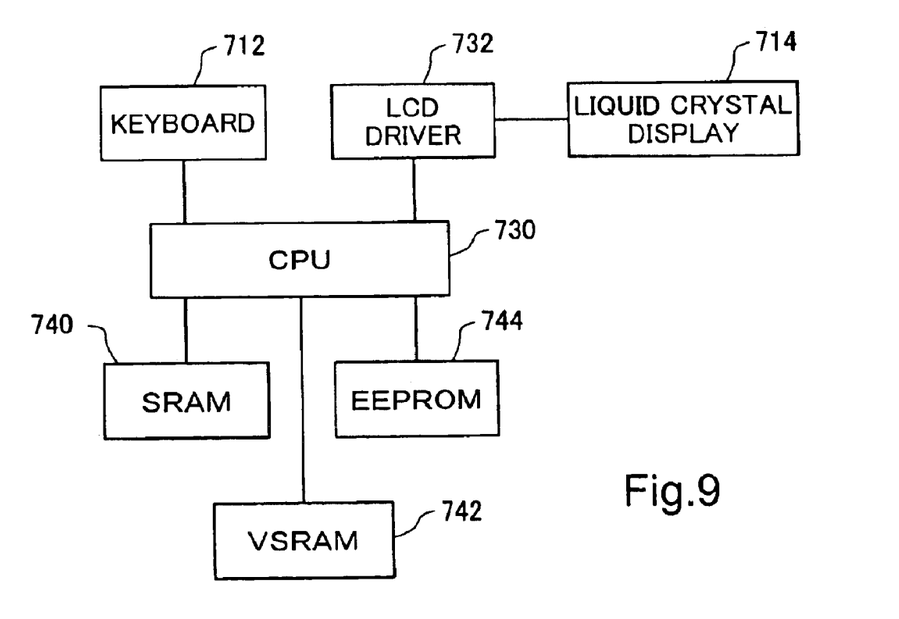
FIG. 9 is a block diagram illustrating the electrical construction of the cellular phone shown in FIG. 8.

FIG. 9 is a block diagram illustrating the electrical construction of the cellular phone 700 shown in FIG. 8. A CPU 730 is connected to the keyboard 712, an LCD driver 732 for actuating the liquid crystal display 714, a SRAM 740, a VSRAM 742, and an EEPROM 744 via bus lines.

The SRAM 740 is used, for example, as a high-speed cache memory. The VSRAM 742 is used, for example, as a working memory for image processing. The memory chip 10 described above is applicable for the VSRAM (virtual SRAM or pseudo SRAM) 742. The EEPROM 744 is used to store various settings of the cellular phone 700.

The VSRAM 742 is kept in the snooze state to pause the operations of the cellular phone 700. In this state, the VSRAM 742 automatically carries out internal refresh, so that data in the VSRAM 742 can be held. The memory chip 10 of the embodiment has a relatively large capacity and thus advantageously holds a mass of data, such as image data, for a long time period.

While the invention has been described with reference to preferred exemplary embodiments thereof, it is to be understood that the invention is not limited to the disclosed embodiments or constructions. On the contrary, the invention is intended to cover various modifications and equivalent arrangements. In addition, while the various elements of the disclosed invention are shown in various combinations and configurations, which are exemplary, other combinations and configurations, including more less or only a single element, are also within the spirit and scope of the invention.

What is claimed is:

1. A semiconductor memory device, comprising:
   a memory cell array of dynamic memory cells;
   an external access timing signal generation module that outputs an external access timing signal used as a reference for an access operation from an external device, the external access timing signal becomes active according to a change of an external address received from the external device;
   an address latch signal generation module that outputs an address latch signal indicating a latch timing of the external address, the address latch signal becomes active according to a timing of an inactivation of the external access timing signal;
   a refresh control module that:
      generates a refresh timing signal used as a reference for an execution timing of a refresh operation to the memory cell array;
      generates a refresh arbiter signal which:
         becomes active according to a timing of an activation of the external access timing signal; and
         does not become active if the external access timing signal becomes active because of a change of an external address during a period in which the address latch signal is active; and
      generates a refresh execution timing signal which becomes active according to an activation of the refresh arbiter signal after an activation of the refresh timing signal; and
   an external access control module that outputs an external access execution timing signal which indicates an execution timing of the access operation to the memory cell array,
      wherein the external access execution timing signal:
         becomes active according to at least a timing of activation of the address latch signal; and then
         becomes inactive according to a timing of activation of the external access timing signal and wherein:
   an active period of the address latch signal is set to be substantially identical to an activation period which is required for one word line to be activated for access to a memory cell corresponding to the external address received from the external device, the one word line being selected from a plurality of word lines included in the memory cell array, and
   an active period of the external access timing signal is set to be substantially identical to a pre-charge period which is required before starting of activation of any word line selected from the plurality of word lines after starting of inactivation of one word line selected from the plurality of word lines.

2. A semiconductor memory device according to claim 1, wherein
   the refresh control module comprises:
      a refresh timer which outputs the refresh timing signal;
      a refresh requirement signal generation module which:
         includes a refresh arbiter module which outputs the refresh arbiter signal, and
         outputs a refresh requirement signal which becomes active according to a timing of an activation of the refresh arbiter signal after an activation of the refresh timing signal; and
      a refresh execution timing signal generation module which outputs the refresh execution timing signal which becomes active according to a timing of an activation of the refresh requirement signal.

* * * * *